United States Patent
Li et al.

(10) Patent No.: US 8,415,788 B2
(45) Date of Patent: *Apr. 9, 2013

(54) SYSTEM AND METHOD FOR DISSIPATING HEAT FROM SEMICONDUCTOR DEVICES

(75) Inventors: Ming Li, Fremont, CA (US); Donald R. Mullen, Mountain View, CA (US)

(73) Assignee: Rambus Inc., Sunnyvale, CA (US)

(*) Notice: Subject to any disclaimer, the term of this patent is extended or adjusted under 35 U.S.C. 154(b) by 343 days.

This patent is subject to a terminal disclaimer.

(21) Appl. No.: 12/860,811

(22) Filed: Aug. 20, 2010

(65) Prior Publication Data

US 2010/0315787 A1    Dec. 16, 2010

Related U.S. Application Data

(63) Continuation-in-part of application No. 12/472,340, filed on May 26, 2009, now Pat. No. 8,039,952, which is a continuation of application No. 10/888,907, filed on Jul. 8, 2004, now Pat. No. 7,538,424.

(51) Int. Cl.
*H05K 7/20* (2006.01)

(52) U.S. Cl.
USPC ........... 257/723; 257/712; 257/720; 257/774; 361/709; 361/717

(58) Field of Classification Search ............ 257/712, 257/723, 774, 720; 361/709, 717
See application file for complete search history.

(56) References Cited

U.S. PATENT DOCUMENTS

| | | | |
|---|---|---|---|
| 5,708,566 A | 1/1998 | Hunninghaus et al. | 361/764 |
| 5,923,084 A | 7/1999 | Inoue et al. | 257/712 |
| 6,608,379 B2 | 8/2003 | Yeo et al. | 257/706 |
| 6,657,296 B2 | 12/2003 | Ho et al. | 257/720 |
| 6,657,311 B1 | 12/2003 | Hortaleza et al. | 257/778 |
| 6,657,864 B1 | 12/2003 | Dyckman et al. | 361/704 |
| 6,685,454 B2 | 2/2004 | Brand | 425/110 |
| 8,039,952 B2* | 10/2011 | Mullen et al. | 257/712 |

OTHER PUBLICATIONS

Office Action for U.S. Appl. No. 12/472,340 dated Feb. 22, 2011, 7 pgs.

* cited by examiner

*Primary Examiner* — Roy Potter
(74) *Attorney, Agent, or Firm* — Morgan, Lewis & Bockius LLP

(57) ABSTRACT

A system includes a circuit board, a multi-die package, and a heat dissipator. The circuit board has substantially planar opposing first and second sides. The multi-die package includes a substrate and a first set of one or more semiconductor devices on a first substrate side and a second set of one or more semiconductor devices on a second substrate side. The multi-die package is located at the first circuit board side. The heat dissipator is located at the second circuit board side, and thermally coupled to the second set of semiconductor devices. One or more portions of the circuit board are removed between the first circuit board side and the second circuit board side so as to define one or more holes through the circuit board and to facilitate thermal coupling between the second set of semiconductor devices and the heat dissipator through the one or more holes.

20 Claims, 16 Drawing Sheets

SYSTEM AND METHOD FOR DISSIPATING HEAT FROM SEMICONDUCTOR DEVICES

CROSS REFERENCE TO RELATED APPLICATIONS

This application is a continuation-in-part of U.S. patent application Ser. No. 12/472,340, filed May 26, 2009 now U.S. Pat. No. 8,039,952, which is a continuation of U.S. patent application Ser. No. 10/888,907, filed Jul. 8, 2004, now U.S. Pat. No. 7,538,424, both of which are incorporated by reference herein in their entireties.

TECHNICAL FIELD

The embodiments disclosed herein relate to heat dissipation from semiconductor devices, and in particular to a system and method for dissipating heat from multi-die packages or stacks of semiconductor devices.

BACKGROUND

As computer systems evolve, so does the demand for increased semiconductor processing power and memory. However, increases in semiconductor processing power and memory typically come at a cost, namely an increase in power consumption of semiconductor devices. Besides the obvious drawbacks of increased energy costs and shorter battery life, increased power consumption also leads to significantly higher operating temperatures of the semiconductor devices. However, in order for the semiconductor devices to operate, heat generated by the semiconductor devices must be dissipated.

Moreover, computer systems often utilize multiple semiconductor devices. Accordingly, manufacturers often bundle multiple semiconductor devices into a single package, otherwise known as a semiconductor module. These semiconductor modules are particularly prevalent in the memory industry, where multiple memory devices are packaged in discrete memory modules. However, packaging multiple semiconductor devices in a single semiconductor module leads to even greater heat generation within the module. This increased heat generation makes subsequent heat dissipation difficult.

Not only has the demand for increased processing power and memory been rapidly increasing, but there has also been a steady increase in demand smaller modules having greater processing power and/or memory. However, any increase in the density of the semiconductor devices within a module exacerbates the heat generation and subsequent dissipation problems.

Even more of a problem arises when high powered memory modules or multi-die packages are used in portable computing systems, such as handheld computers, laptops, and cellular phones, where space is at a premium. Unlike desktop computers that have a relatively large volume of unused space within the computer chassis or case, the chassis of portable computing systems typically have little or no space for air to circulate in and around the memory module. For example, Small Outline Dual In-line Memory Modules (SO-DIMMs or SODIMMs), are typically used in notebook computers and rack-mounted servers for their small size as compared to regular Dual In-line Memory Modules (DIMMs), which are typically used in desktop computers. However, due to the form factor of notebook computers, such SODIMMs are typically placed parallel to the laptop's motherboard and not perpendicular, as is typically the case with memory modules in desktop computers. Memory devices on the side of the memory module facing away from the circuit board can dissipate some heat. However, memory devices facing the motherboard typically only have a very small space between the memory module and the motherboard and therefore have poor heat dissipation path, as little or no air circulates around the small space between the memory module and the mother-board.

Accordingly, a system and method to more effectively dissipate heat from a semiconductor module or multi-die package would be highly desirable.

BRIEF DESCRIPTION OF THE DRAWINGS

For a better understanding of the nature and objects of the invention, reference should be made to the following detailed description taken in conjunction with the accompanying drawings, in which.

Like reference numerals refer to the same or similar components throughout the several views of the drawings.

DETAILED DESCRIPTION OF THE EMBODIMENTS

The following description details various systems for dissipating heat from a semiconductor module disposed within a computing system. Most of these systems include a semiconductor module located on one side of a circuit board, and a heat dissipator located on the other side of the circuit board. One or more thermal vias then extend through the circuit board to thermally couple the semiconductor module to the heat dissipator. Accordingly, these systems increase overall heat dissipation from the semiconductor module by facilitating heat dissipation through the circuit board. This increased heat dissipation lowers the operating temperature of the semiconductor module, thereby reducing semiconductor device malfunctions and increasing the life of the semiconductor devices. In embodiments, due to better heat dissipation, the semiconductor devices may operate at higher frequencies. The increased heat dissipation also efficiently addresses confined space considerations associated with portable computing devices. Furthermore, the increased heat dissipation also addresses the above described problems associated with high powered processors and memory, as well as the problems associated with increased semiconductor device density within semiconductor modules.

Figure 1A:
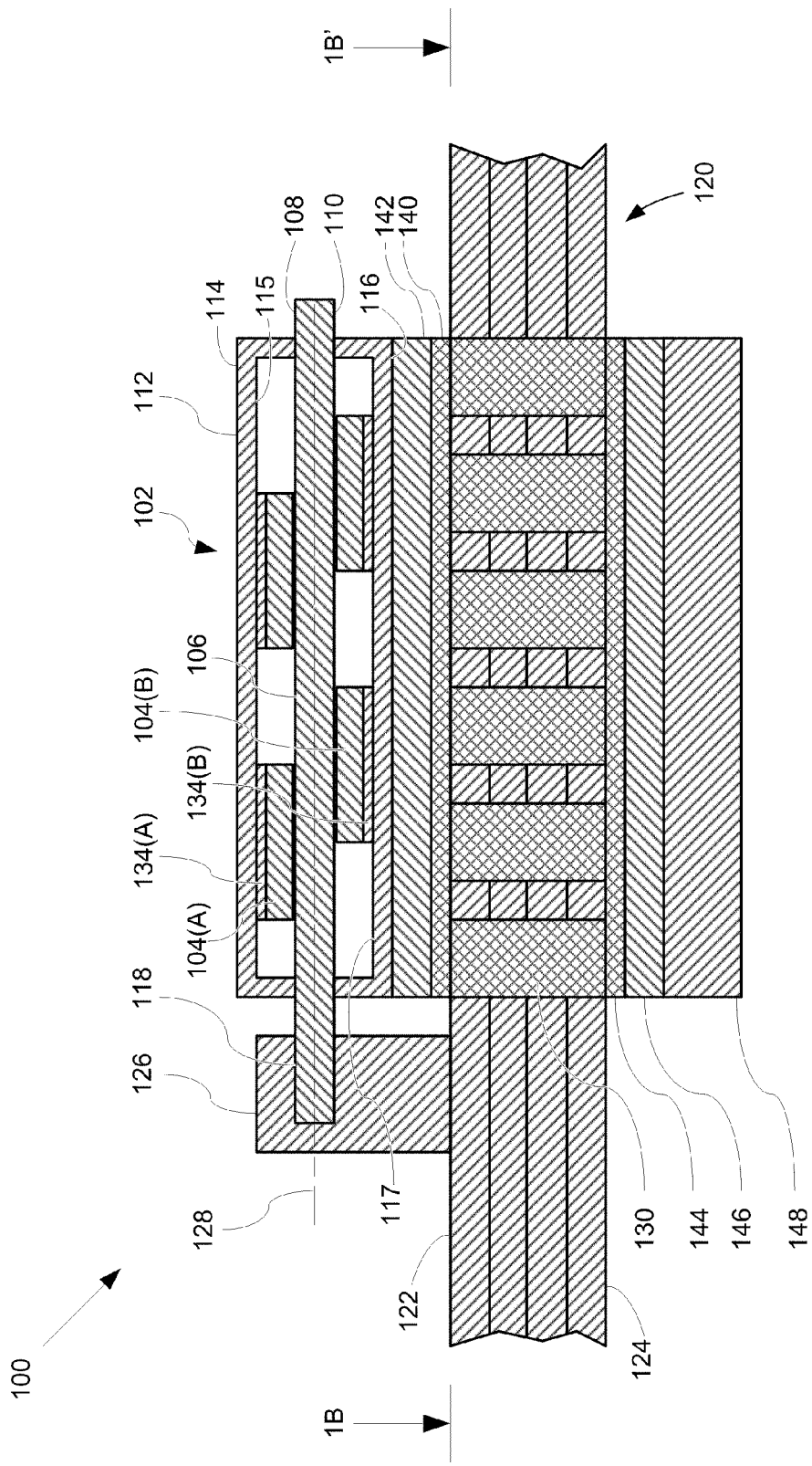
FIGS. 1A, 2, 3A, 4, 5, 6A, 7, and 8 are all partial cross sectional views of different systems for dissipating heat from a semiconductor module.

FIG. 1A is a partial cross sectional view of a system 100 configured to dissipate heat from a semiconductor module 102. The semiconductor module 102 includes multiple integrated circuits or semiconductor devices 104. These semiconductor devices 104 may be electrically and mechanically coupled to a semiconductor module circuit board 106. The semiconductor circuit board has substantially flat opposing sides, namely a first side 108 and second side 110. As used herein, the terms "substantially flat" and "substantially planar" are used to describe the two opposing sides of a substrate or circuit board. Generally, a rectangular substrate has two opposing substantially planar sides (e.g., top and bottom), where electrical components can be attached to, and four other edges. The terms "substantially flat" and "substantially planar" are used to distinguish these two opposing sides from the four other edges (or any other number of edges), and should not be understood as a limit on the amount of flatness of the substrate or circuit board. A substrate side (or a circuit board side) can be deemed to be substantially planar, regardless of an existence or absence of traces, holes, pins, grids, pads, or other structures on the substrate side. In some embodiments, some semiconductor devices 104(A) are positioned on the first side 108 of the semiconductor module circuit board 106, while other semiconductor devices 104(B) are positioned on the second side 110 of the semiconductor module circuit board 106. The semiconductor devices 104 and/or semiconductor module circuit board 106 may be enclosed at least partially within a semiconductor module housing 112. If present, the semiconductor module housing 112 has opposing sides, namely a first exterior side 114, a first interior side 115, a second exterior side 116, and a second interior side 117. The sides of semiconductor devices 104 that are not coupled to the semiconductor module circuit board 106 are attached to the semiconductor module housing 112 using a thermal interface material (TIM) 134. In other words, the semiconductor devices 104(A) and 104(B) are attached to the first interior side 115 and second interior side 117 of the semiconductor module housing 112 using TIM 134(A) and 134(B) respectively.

The semiconductor module circuit board 106 may include an electrical connector, such as a card-edge connector 118, for electrically connecting the semiconductor module 102 to the remainder of the system 100.

In some embodiments the semiconductor module 102 is a SODIMM typically used in portable computing systems, such as laptop or notebook computers. Alternatively, the semiconductor module 102 may be a SIMM (single in-line memory module) or a DIMM.

The system 100 includes a circuit board 120, such as a computer system's motherboard, printed wiring board, printed circuit board (PCB), interconnect substrate or the like. In some embodiments, the circuit board 120 is a multilayer FR-4 motherboard. The circuit board 120 has two substantially flat opposing sides, namely a first side 122 and a second side 124.

Attached to the circuit board is at least one connector 126 for mechanically and/or electrically coupling the semiconductor module 102 to the circuit board 120. In some embodiments, the connector 126 is coupled to the circuit board 120 at the circuit board's first side 122. Also in some embodiments, the connector 126 is a horizontal connector that includes a female slot for receiving the male card-edge connector 118 of the semiconductor module 102. The horizontal connector orients the semiconductor module parallel to the circuit board, leaving a small gap between the semiconductor module and circuit board. Alternatively, the connector 126 may be any ISA Bus slot, multi-pin socket, DIMM bank, or the like for electrically coupling the module 102 to the circuit board 120.

In this embodiment, once coupled to the connector 126, the semiconductor module 102 is oriented substantially parallel to the circuit board 120, i.e., a longitudinal axis 128 of the semiconductor module circuit board 106 is oriented substantially parallel to the circuit board 120. This orientation is common for SODIMMs found in portable computing systems, as vertical space (perpendicular to the circuit board 120) within the portable computing devices is limited. For example, many laptop or notebook computers are currently less than 1 inch (25 mm) thick. SODIMMs are generally over 1 inch (25 mm) in height, but generally have a thickness of only 0.1 inch (2.5 mm). Accordingly, manufacturers tend to orient SODIMMs parallel to the notebook computer's motherboard to conserve vertical space. This translates into a thinner notebook computer.

As described above, if not addressed, heat dissipation problems for higher powered semiconductor devices 104 may arise with this parallel orientation of the semiconductor module 102 with respect to the circuit board 120. Generally, heat generated by the semiconductor devices 104(A) on the first side 108 of the semiconductor module circuit board 106 dissipates away from the semiconductor module 102 through both the circuit board 106 and TIM 134(A) to the first exterior side 114 of the semiconductor module housing 112, i.e., heat could dissipate effectively upwards in FIG. 1A from the first interior side 115 to the exterior side 114 of the semiconductor module housing 112. If necessary, other cooling means like heat sink, heat spreader or system chassis/case could attach to this first exterior side 114 to dissipate more heat from semiconductor devices 104(A), as described below. However, heat generated by the semiconductor devices 104(B) on the second side 110 of the semiconductor module circuit board 106 cannot be dissipated as effectively. This is because heat generated by the semiconductor devices 104(B) is dissipated through the TIM 134(B) from the second interior side 117 to the second exterior side 116 of the semiconductor module housing 112 and is blocked by the second side 110 of the circuit board 106, i.e., heat can only dissipate downwards in FIG. 1A. This problem is exacerbated by manufacturers who leave almost no space between the second side 116 of the semiconductor module housing 112 and the circuit board 120, in order to conserve space perpendicular to the circuit board 120. Accordingly, the present embodiment addresses the above described heat build-up between the semiconductor module 102 and the circuit board 120 by transferring or conducting heat through the circuit board 120 using one or more thermal vias 130.

The one or more thermal vias 130 are formed through the circuit board 120 to conduct heat from the first side 122 of the circuit board 120 to the second side 124 of the circuit board 120. The thermal vias 130 are any thermally conductive material that is capable of transferring or conducting heat through the circuit board 120.

Figure 1B:
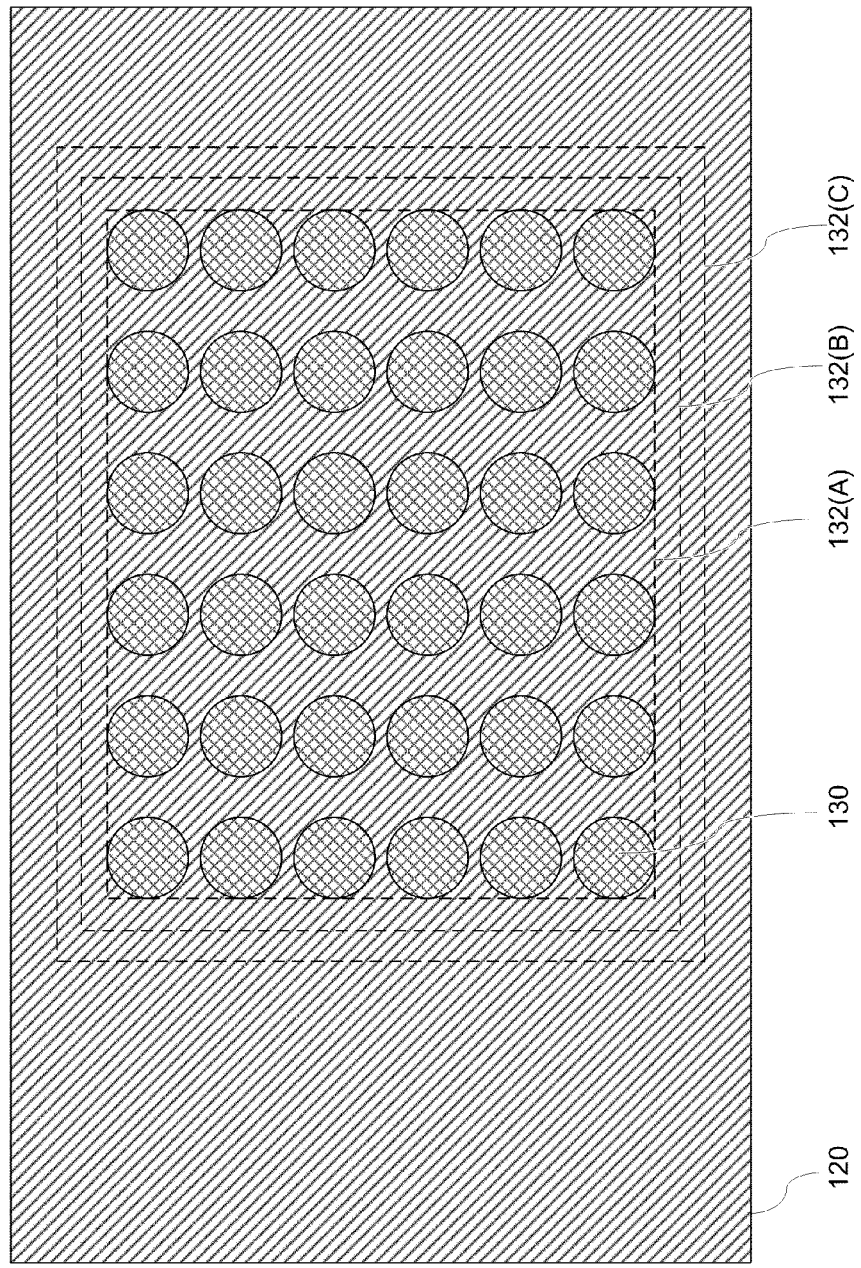
FIG. 1B is partial cross sectional view of the system shown in FIG. 1A, taken along line 1B-1B'.

In some embodiments, the thermal vias 130 form an array of hollow vias through the circuit board 120. In other embodiments, the thermal vias 130 are hollow vias plated with a thermally conductive material, such as copper, gold, aluminum, magnesium, tungsten, or the like. In yet other embodiments, the thermal vias 130 are posts of thermally conductive material, as shown in FIGS. 1A and 1B. The posts may be solid, e.g. solid copper or gold, hollow vias filled with a thermally conductive material, or hollow vias plated with a thermally conductive material and then filled with a thermally conductive material. The thermally conductive material used to fill the hollow vias may be a thermally conductive paste, such as solder based paste (later reflowed), epoxy based pastes with or without alumina or boron nitride fillers, 80% tungsten and 20% copper powder mixer, or no-shrink via filler material (Peters SD 2361), etc. These posts provide better thermal conductivity than hollow or plated vias.

Although not necessary, the overall region or area 132(A), 132(B) and/or 132(C) (FIG. 1B) of the array of thermal vias 130 facing the semiconductor module 102 cover at least as large an area as the semiconductor devices 104(B) or the side 116 of the semiconductor module 102, as best seen in both FIGS. 1A and 1B. In other words, the location of the thermal vias 130 should correspond to the location of the semiconductor devices 104(B) and/or the second side 116 of the semiconductor module 102 facing the circuit board 120. The overall area 132 of the thermal vias 130 facing the semiconductor module 102 may of course be smaller or larger that the semiconductor devices 104(B) or semiconductor module 102.

Furthermore, the array of thermal vias 130, as shown in FIG. 1B, should be as densely packed as possible, while addressing other considerations of the circuit board design and manufacture. In other words, the more thermal vias 130 through the circuit board 120, the better the thermal conductivity through the circuit board and away from the semiconductor module 102.

In some embodiments, where wire routing on the circuit board 120 is allowed, a first layer 140 extends across the top openings of thermal vias 130 at the first side 122 of the circuit board 120, as shown in FIGS. 1A and 1B. This first layer 140 may form part of the first side 122 of the circuit board 120 and covers the array of thermal vias 130. Likewise, a second layer 144 may form part of the second side 124 of the circuit board 120, and extend over the array of thermal vias 130. In some embodiments, the first and second layers are solid copper layers. The thickness of first and second layers 140 and 144 may vary from 17.5 to 70 microns depending on plating technology that the circuit board 120 employs. It should be noted that the thickness of first and second layers 140 and 144 may be same or different.

In some embodiments, the first and second layers cover the array of thermal vias 130 on the first and second sides 122 and 124 of the circuit board 120. In other words, the size of the first and second layers 140 and 144 may be same as area 132(A), 132(B) or 132(C). Therefore, in some embodiments, the first and second layers may mirror one another in size and location above and below the circuit board 120. Alternatively, the size of layers 140 and 144 may be different. Also, the first and second layers 140 and 144 may act as heat spreading layers to spread heat.

Returning to FIG. 1A, the system 100 may also include third layer 142 and fourth layer 146 of thermal interface material or TIM disposed on top of the first and second layers 140 and 144 respectively. The TIM is any thermally conductive material. In some embodiments, the TIM may be a fluidic material that sets or cures hard. In other embodiments, the TIM may be a material having viscosity, elasticity or resiliency, or a material that has viscosity, elasticity or resiliency once set or cured. In some embodiments the same TIM is used as fill in the thermal vias 130, i.e., the same material is used to construct the thermal vias as to form the first and/or second layers adjacent to the circuit board.

In the embodiment shown in FIG. 1A, the third layer 142 thermally couples the first layer 140 to the semiconductor module 102, and the fourth layer 146 thermally couples the second layer 144 to a heat dissipator 148. Alternatively, the first and second layers 140 and 144 may be absent and the third and fourth layers 142 and 146 may directly contact the first side 122 and second side 124 of the circuit board 120 respectively. By thermally coupled it is meant that the components thermally coupled to one another can transfer or conduct heat between one another.

In some embodiments, the third layer 142 is formed from a resilient or elastic TIM that is compressed when the semiconductor module 102 is coupled to the connector 126. The thickness of the third layer may be slightly larger than the gap height between the semiconductor module and the first layer 140. In some embodiments, this increases the likelihood of proper thermal coupling between the third layer 142 and the semiconductor module 102. Also in some embodiments, the thickness of the third layer may be between 100% and 120% of the gap height between the semiconductor module and the first layer 140. Furthermore, the fourth layer 146 may have adhesive properties to couple the heat dissipator 148 to the second copper plane 144.

Figure 2:
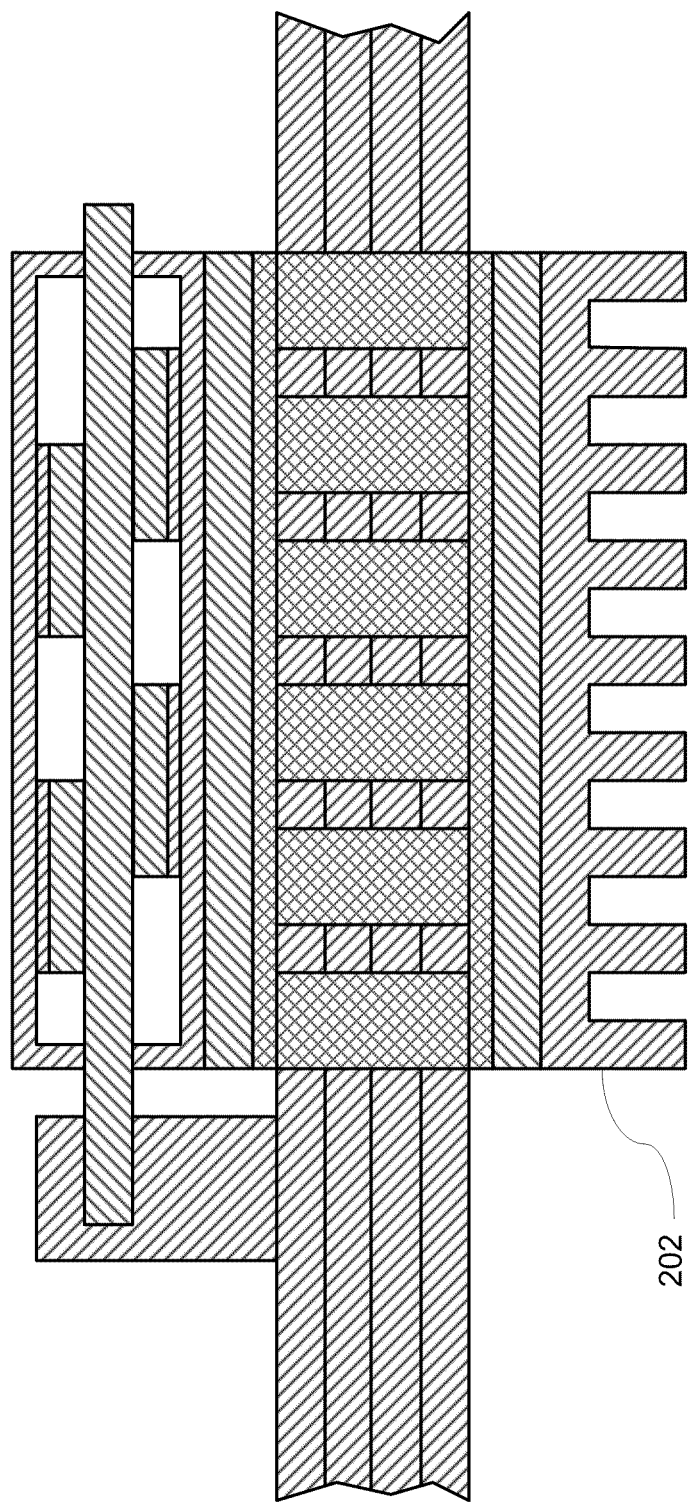

The heat dissipator 148 may be any suitable device for dissipating heat. In some embodiments, as shown in FIG. 2, the heat dissipator 148 (FIG. 1) is a suitable heat sink or heat spreader 202. The heat sink or heat spreader 202 is configured to dissipate heat absorbed from the semiconductor module 102 through the various layers 140, 144, 142 and/or 146 and thermal vias 130. Heat is dissipated to the area surrounding the heat spreader 202. In some embodiments, the heat spreader 202 has multiple fins to increase the surface area of the heat spreader 202 that is exposed to the surrounding air. The increased surface area improves heat dissipation. The heat spreader is made from any suitable thermally conductive material, such as aluminum, copper or magnesium and their alloys.

Figure 3A:
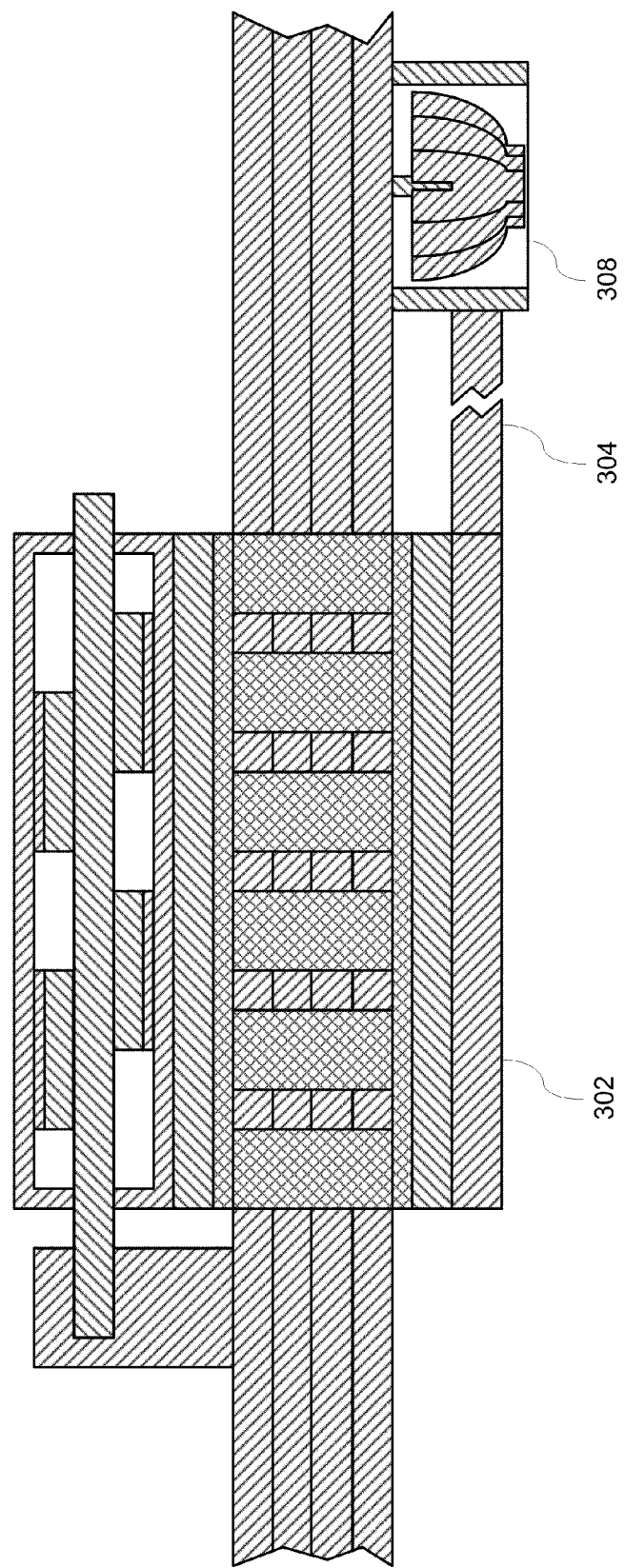
Figure 3B:
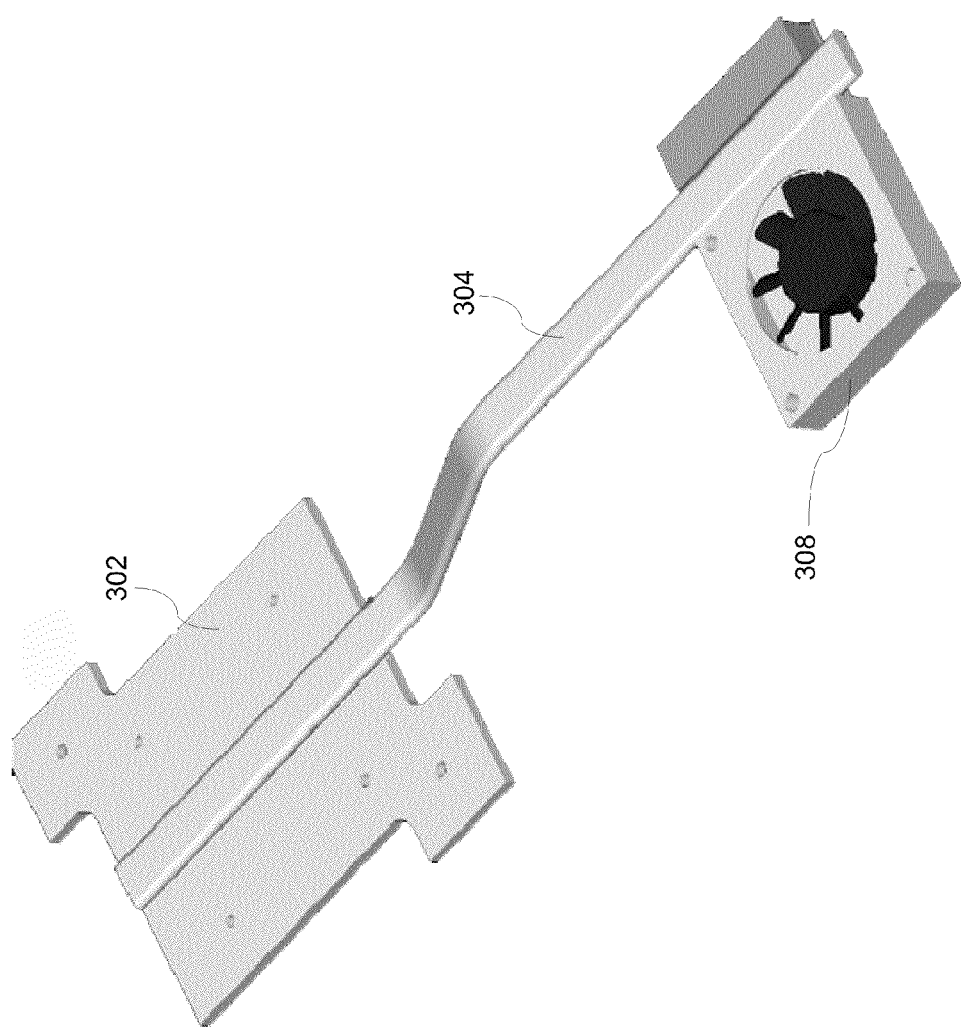
FIG. 3B is an isometric view of the heat dissipation mechanism shown in FIG. 3A.

In another embodiment, shown in FIGS. 3A and 3B, the heat dissipator 148 (FIG. 1) includes a heat spreader 302 thermally coupled to a heat sink, heat spreader, or cooling fan 308. The heat spreader 302 may be thermally coupled to the heat sink or spreader, or cooling fan 308, via a heat pipe 304. The heat spreader 302, heat pipe 304 and heat sink, heat spreader, or cooling fan 308 are all thermally conductive.

The heat spreader 302 is thermally coupled to the semiconductor module 102 through the various layers 140, 144, 142 and/or 146 and thermal vias 130 (all of FIG. 1). Heat absorbed by the heat spreader 302 is transferred or conducted along the heat pipe 304 to the heat sink, heat spreader, or cooling fan 308, where it is dissipated.

In some embodiments, the heat pipe 304 is a thermally conductive sleeve (aluminum, copper, etc.) that holds a liquid (water, acetone, etc.) under pressure, and the inner surface of the sleeve is lined with a porous material that acts as a wick. When heat is applied to the outer area of the sleeve at the heat spreader 302, the liquid inside the tube boils and vaporizes into a gas that moves through the sleeve seeking a cooler location (at the heat sink, heat spreader, or cooling fan 308) where it condenses. Using capillary action, the wick transports the condensed liquid back to the evaporation area at the heat spreader 302.

The heat sink, heat spreader, or cooling fan 308 is preferably placed at a location that is easier to cool. For example, the cooling fan 308 may be located underneath a notebook computer and be exposed to the ambient air surrounding the notebook computer's chassis. In some embodiments, the same heat sink, heat spreader, or cooling fan 308 may be used to cool the notebook computer's CPU and its memory. Also in some embodiments, the heat sink or heat spreader 308 may be the exterior wall of the computing device's chassis or case. In this embodiment, the combination of heat pipe coupled to the chassis or case eliminates the need for a fan.

Figure 4:
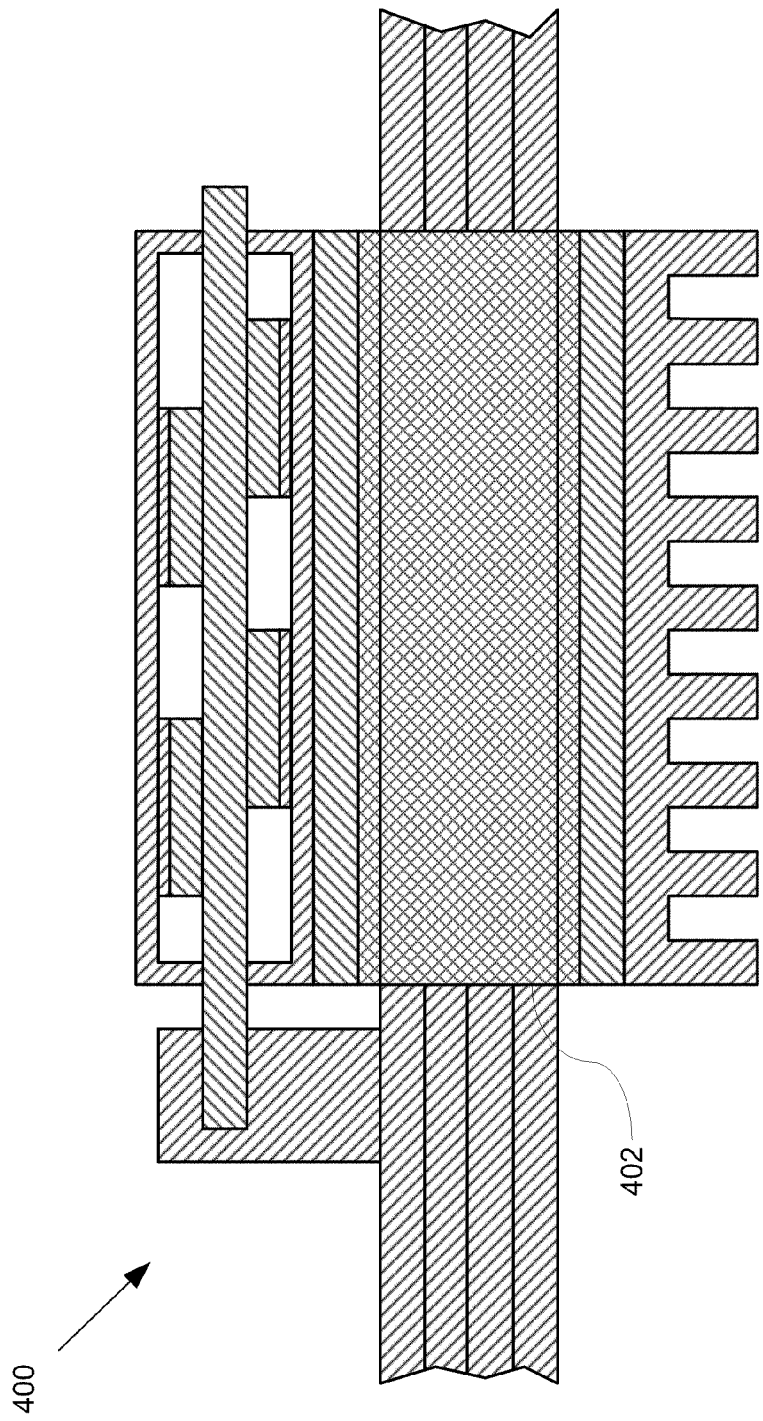

FIG. 4 is a partial cross-sectional view of another system 400 for dissipating heat from a semiconductor module. In this embodiment, the thermal vias 130 of FIG. 1 have been replaced by one large thermal via 402. The thermal via 402 is similar to the thermal vias 130 (FIG. 1). The thermal via 402 may be a solid metal or it may be a thermally conductive paste that maximizes thermal conductivity through the circuit board 120 (FIG. 1).

Figure 5:
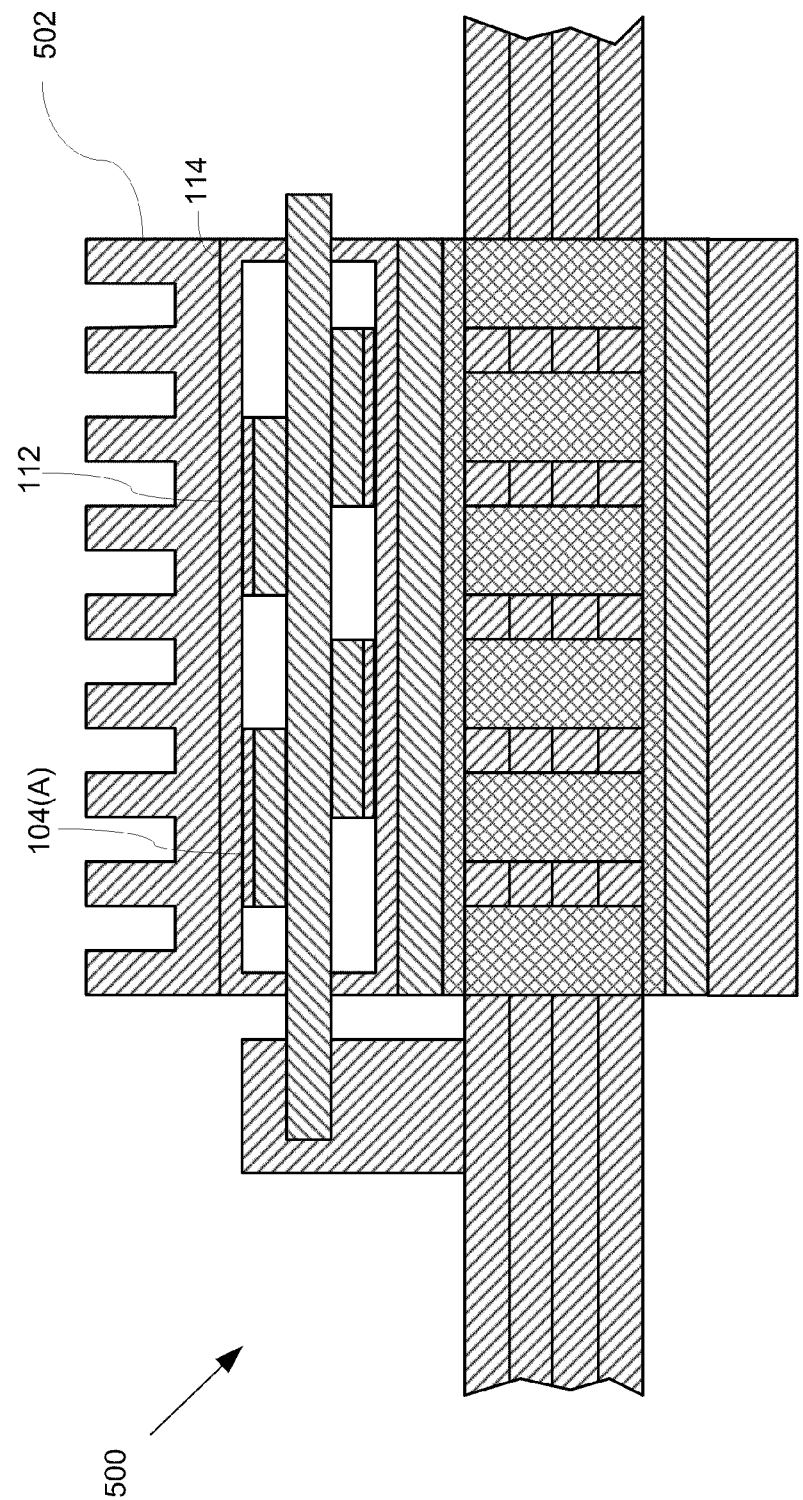

FIG. 5 is a partial cross-sectional view of yet another system 500 for dissipating heat from a semiconductor module. Here, an additional heat sink or spreader 502 is thermally coupled to the side 114 of the semiconductor module 102 (FIG. 1A) furthest from the circuit board 120 (FIG. 1A). The heat spreader 502 may be affixed to the semiconductor module housing 112 using a thermally conductive adhesive. Alternatively, the heat spreader 502 may be affixed directly to the exposed surface of the semiconductor devices 104(A) furthest from the circuit board 120 (FIG. 1A), in embodiments where the first side 114 of the semiconductor module housing 112 is not present. Accordingly, in this embodiment, the semiconductor module 102 (FIG. 1A) may be distributed with the heat spreader 502 affixed to one side thereof. This configuration has the additional advantage that the semiconductor module cannot be inserted into the connector 126 (FIG. 1A) with the wrong side up, a problem that is typically addressed by keying the card-edge connector 118 (FIG. 1A) and the connector 126 (FIG. 1A).)

In some embodiments, the heat spreader 502 has multiple fins to increase the surface area of the heat spreader 502 that is exposed to the surrounding air. The increased surface area improves heat dissipation. The heat spreader is made from any suitable thermally conductive material, such as aluminum. Accordingly, in use, the heat spreader 502 and the heat dissipator 148 (FIG. 1A) collectively dissipate heat away from the semiconductor module 102 (FIG. 1A).

Figure 6A:
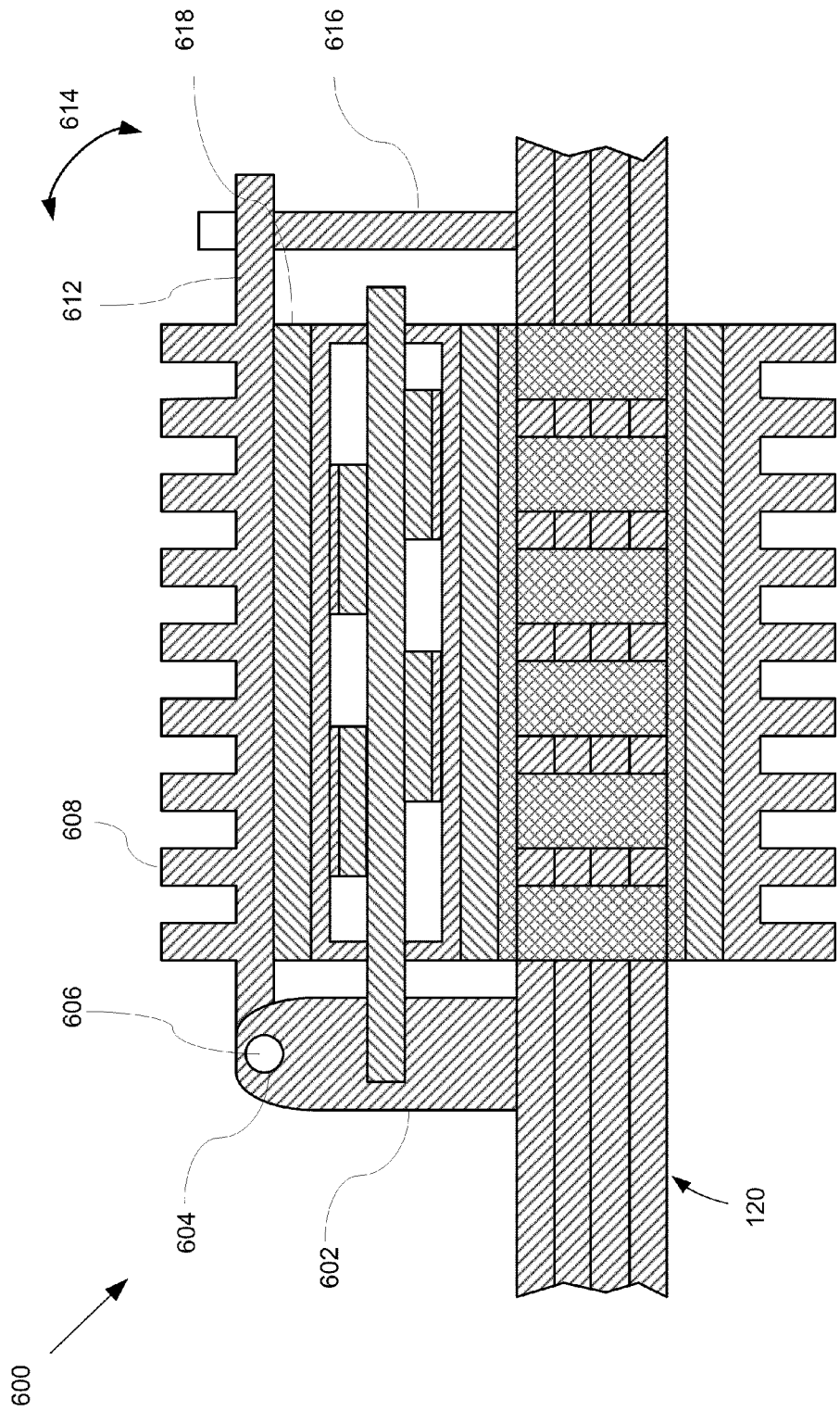
Figure 6B:
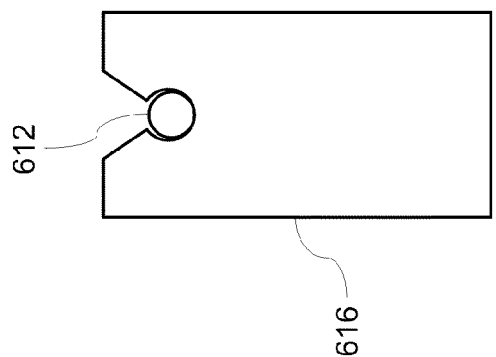
FIG. 6B is a front view of the latch shown in FIG. 6A.

FIG. 6 is a partial cross-sectional view of another system 600 for dissipating heat from a semiconductor module. In this embodiment, the connector 602 includes a bearing 604 in which a rotatable pivot 606 is positioned. The rotatable pivot 606 is coupled to a heat sink or spreader 608, thereby allowing the heat spreader 608 to rotate about the pivot 606 as shown by arrow 614. The heat spreader 608 is similar to the heat spreaders described above. The heat spreader 608 also includes an arm 612 that extends from, and substantially parallel to, the heat spreader 608. The arm 612 is configured and dimensioned to be received by a latch 616. Once in place, the latch prevents the heat spreader from freely rotating. A front view of the latch and arm can be seen in FIG. 6B.

The underside of the heat spreader 608 that faces the semiconductor module may include a layer 618 of TIM. In some embodiments, the layer 618 is resilient and slightly thicker than the space between the heat spreader 608 and the semiconductor module. Accordingly, in use, the arm 612 is first pulled free from the latch 616. The semiconductor module is then mated with the connector 602 such that the semiconductor module is oriented substantially parallel with the circuit board, as described above. The heat spreader 608 is then rotated towards the latch 616 such that the layer 618 of resilient TIM is compressed between the heat spreader 608 and the semiconductor. This resiliency in the layer 618 facilitates contact for thermal conductivity between the semiconductor module and the heat spreader. The arm 612 is then forced into the latch 616, thereby locking the heat spreader and layer 618 into contact with the semiconductor module.

Figure 7:
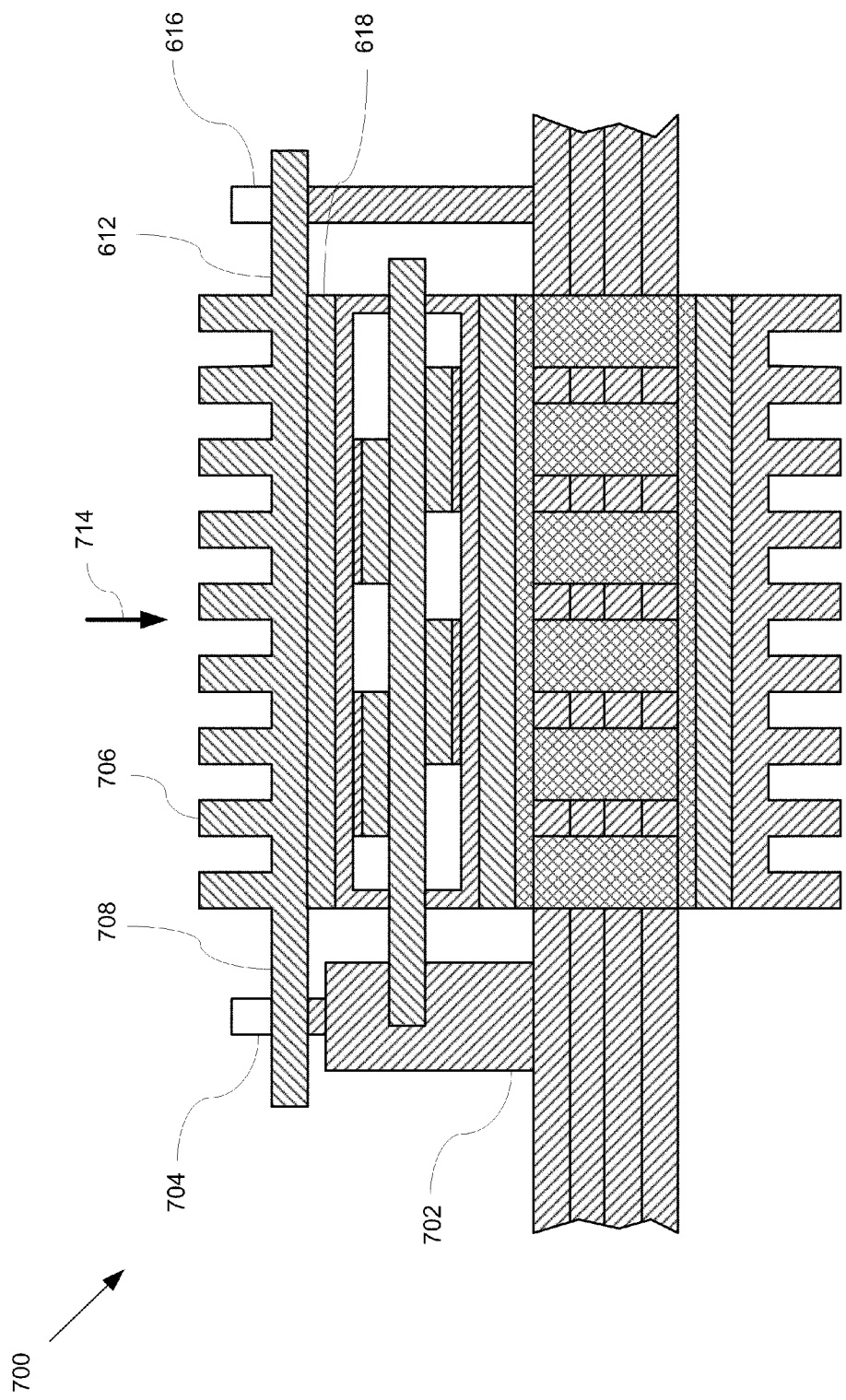

FIG. 7 is a partial cross-sectional view of yet another system 700 for dissipating heat from a semiconductor module. The system 700 is similar to the system 600 shown in FIGS. 6A and 6B. In this embodiment, a connector 702 is coupled to the circuit board 120 (FIG. 1). The connector 702 includes a latch 704 similar to latch 616 described in relation to FIGS. 6A and 6B. A heat spreader 706 is configured to be removably coupled to the circuit board. The heat spreader 706 includes an additional arm 708 that extends in the opposite direction to the arm 612 described in relation to FIG. 6A. In use, the heat spreader 706 is pressed downward towards the circuit board, as shown by arrow 714. In doing so, the arms 708 and 612 engage with the latches 704 and 616 to securely couple the heat spreader 706 to the semiconductor module. In the process of coupling the heat spreader to the semiconductor module, the layer 618 of TIM may be compressed, thereby ensuring adequate thermal contact between the semiconductor and the heat spreader.

Figure 8:
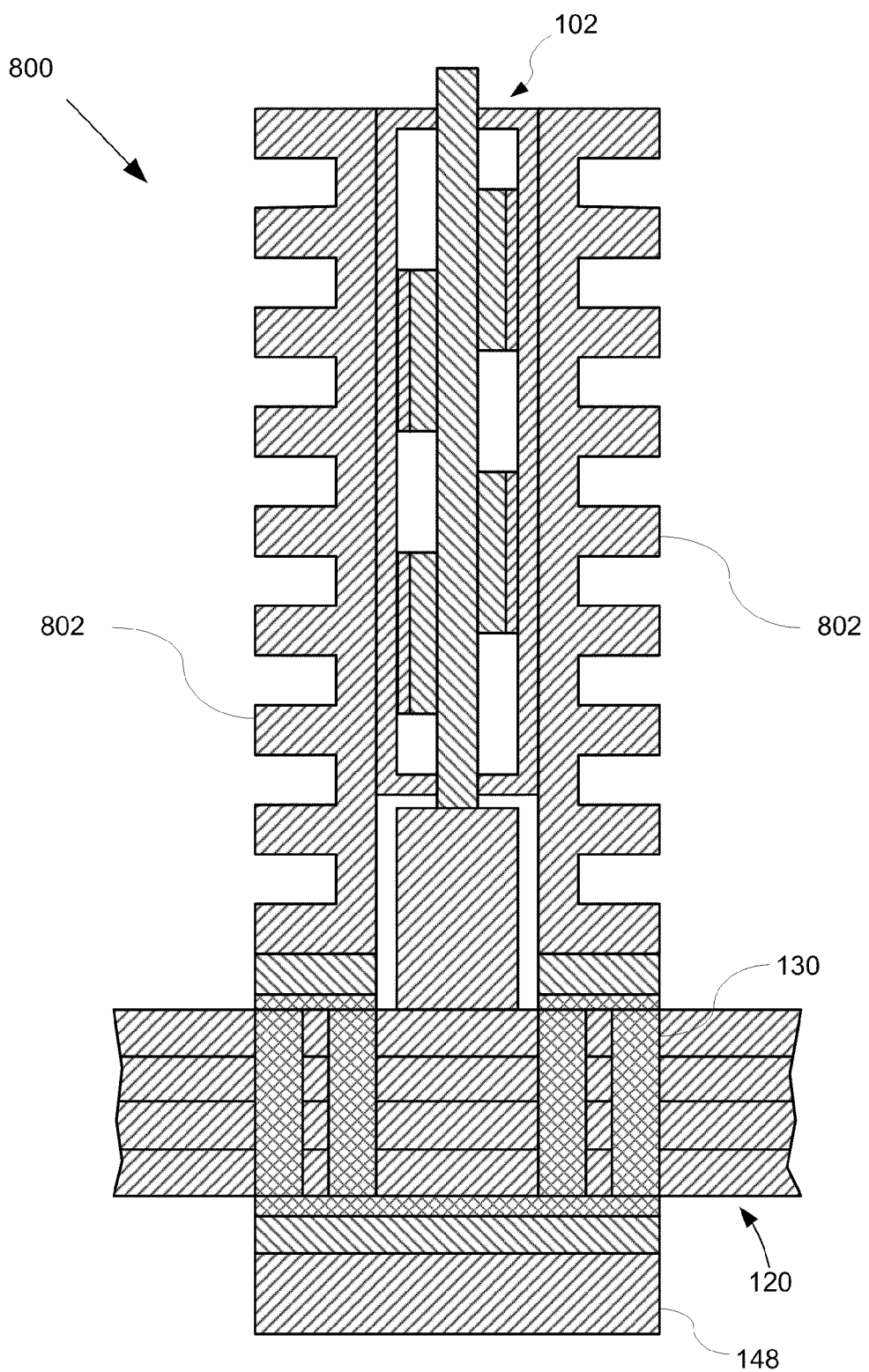

FIG. 8 is a partial cross-sectional view of one other system 800 for dissipating heat from a semiconductor module. As shown, a heat dissipator 148 is positioned on the opposite side of the circuit board 120. In this embodiment the semiconductor module 102 is oriented substantially perpendicular to the circuit board 120 and a heat spreader 802 is placed on each side of the semiconductor module 102. The heat spreaders 802 are thermally coupled to the heat dissipator 148 through one or more layers of TIM and the thermal via(s) 130. In use, heat generated by the semiconductor module 102 is dissipated both from the heat spreaders 802 and the heat dissipator 148.

Figure 9:
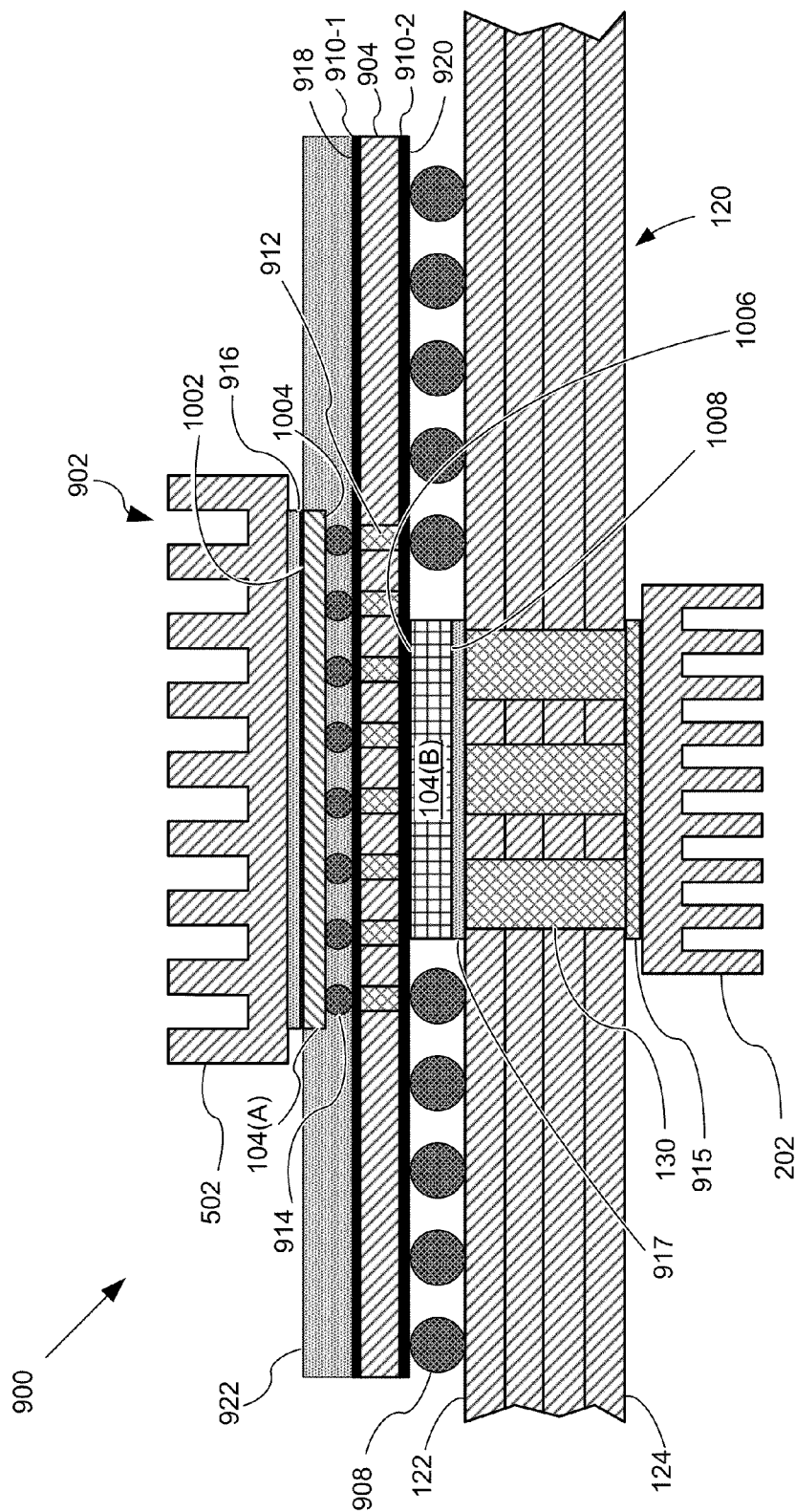
FIGS. 9, 10, and 13 are partial cross sectional views of different systems for dissipating heat from multi-die packages.
Figure 10:
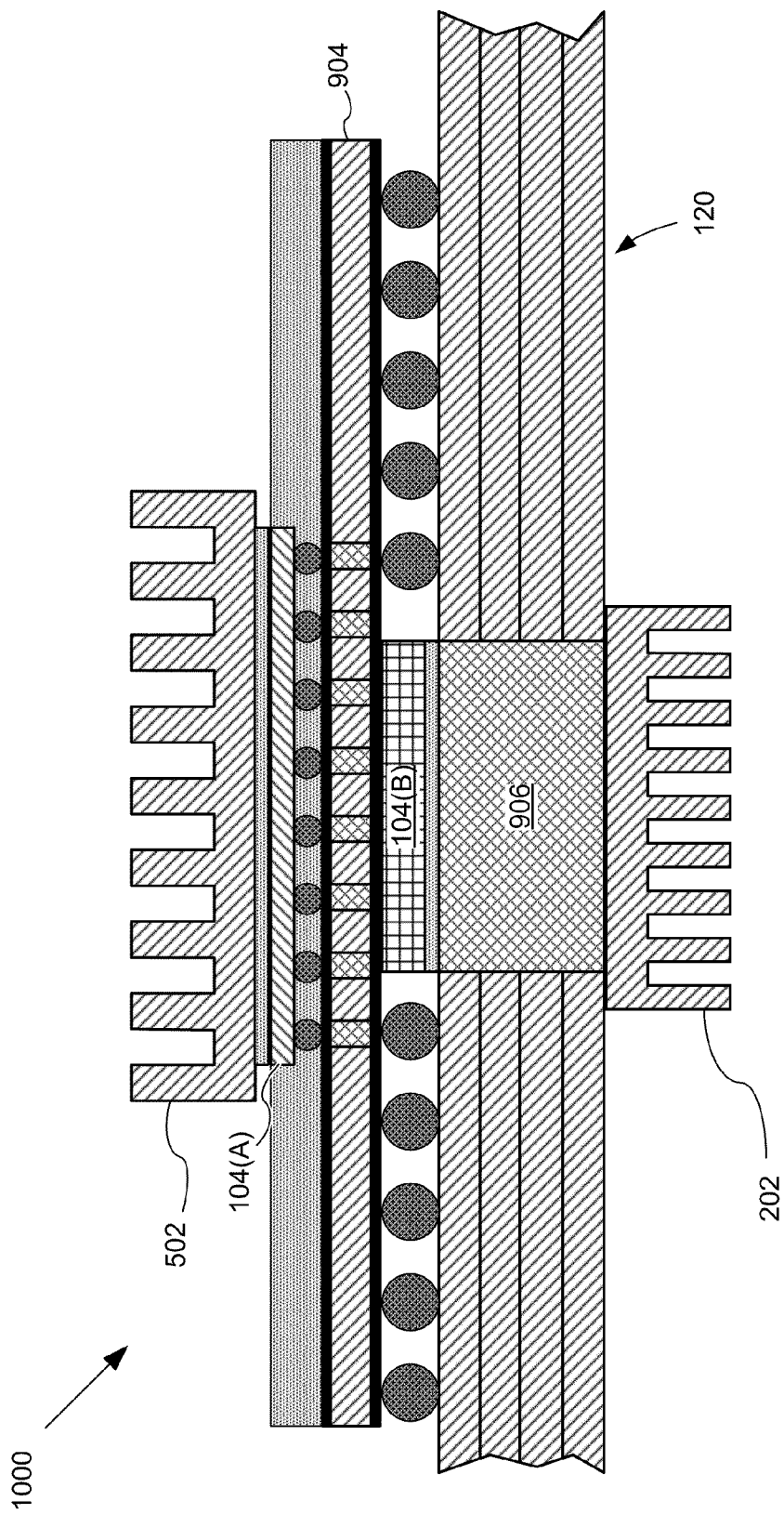

FIGS. 9 and 10 describe embodiments of multi-die packages (also called system-in-packages, multi-die modules, or 3D packages). As described above with respect to modules, effective heat dissipation is also desirable for multi-die packages mounted on a circuit board. In some embodiments, the multi-die package includes multiple semiconductor devices disposed on a single (or unifying) substrate. In other embodiments, the multi-die package includes multiple semiconductor devices disposed on multiple substrates. While the multi-die packages have a high density of semiconductor devices, the increase in density exacerbates heat generation and subsequent heat dissipation problems.

In some embodiments, semiconductor devices are mounted on both sides of the substrate, i.e., a first set of one or more semiconductor devices are mounted on a first side of the substrate remote from the circuit board, and a second set of one or more semiconductor devices are mounted on an opposing second side of the substrate adjacent to the circuit board. The first set of semiconductor devices can more easily dissipate heat to the surrounding space than the second set of semiconductor devices, as little or no air circulates around or through the limited space between the second semiconductor devices and the circuit board.

Such problems can be addressed by using cutaways and/or thermal vias as described above. This provides more effective heat dissipation, because the heat generated by the multi-die package, in particular the heat generated by the semiconductor devices located on the multi-die package facing the circuit board, can be effectively dissipated through the cutaways and/or the thermal vias to the opposite side of the circuit board.

FIG. 9 is a partial cross-sectional view of a system 900 for dissipating heat from a multi-die package 902. The multi-die package 902 is mechanically and/or electrically coupled to a circuit board 120.

In some embodiments, a multi-die package 902 includes a substrate such as an interposer 904 designed to facilitate electrical coupling of semiconductor devices to a circuit board. The multi-die package 902 also includes a first set 104(A) of one or more semiconductor devices, and a second set 104(B) of one or more semiconductor devices. In some embodiments, the first set 104(A) of semiconductor devices is a single graphics processing unit (GPU) and the second set 104(B) of semiconductor devices is a stack of one or more memory dies. In such embodiments, the multi-die package may be called a system-in-package. In some embodiments, the first set 104(A) of semiconductor devices includes two or more semiconductor devices that are disposed adjacent to or on top of one another. In some embodiments, the second set 104(B) of semiconductor devices includes two or more semiconductor devices that are disposed adjacent to or on top of one another.

In some embodiments, the first set 104(A) and/or the second set 104(B) of semiconductor devices includes one or more memory devices. In some embodiments, the first and/or second set of semiconductor devices includes one or more stacks of semiconductor devices. In some embodiments, the first set 104(A) of semiconductor devices includes at least one logic device (e.g., a processor, such as a central processing unit (CPU) or a GPU, or any other logic device, such as an ASIC). In some embodiments, the second set 104(B) of semiconductor devices includes at least one processor device.

In the system 900, the first set 104(A) of semiconductor devices have a first side 1002 and an opposing second side 1004, and the second set of semiconductor devices has a first side 1006 and an opposing second side 1008. The interposer 904 has a substantially planar first substrate side 918 and an opposing substantially planar second substrate side 920. Similarly, the circuit board 120 has a substantially planar first circuit board side 122 and an opposing substantially planar second circuit board side 124. The second side 1004 of the first set 104(A) of semiconductor devices is coupled to the first substrate side 918. The first side 1006 of the second set 104(B) of semiconductor devices is coupled to the second substrate side 920. The first circuit board side 122 is coupled to the second substrate side 920, such as through solder connections (e.g., using solder balls 908 shown in FIG. 9, or any other suitable electrical connections).

In some embodiments, the interposer 904 includes a plurality of vias 912 to couple the first set 104(A) of semiconductor devices to the second set 104(B) of semiconductor devices. In some embodiments, the first set 104(A) of semiconductor devices are coupled to the vias 912 by solder balls 914. In some embodiments, the second set 104(B) of semiconductor devices are also coupled to the vias 912 by solder balls 914. Alternatively, the first set 104(A) and/or second set 104(B) of semiconductor devices can be electrically coupled to the vias 912 and/or the interposer 904 using any other suitable electrical connector, such as wires, pins, or leads. In some embodiments, where the interposer 904 comprises a silicon interposer, the vias 912 are through-silicon vias (TSVs). In some embodiments, the TSVs have a pitch from 50 to 150 µm and a corresponding diameter from 20 to 100 µm.

In some embodiments, the interposer 904 includes redistribution layers 910-1 and 910-2 on or in the first substrate side 918 and the second substrate side 920, as shown in FIG. 9. The redistribution layers 910-1 and 910-2 allow relocation or redistribution of electrical connection points (e.g., bond pads) for electrical coupling.

In some embodiments, the multi-die package 902 typically is molded or overmolded to encapsulate at least a portion of the first set 104(A) of semiconductor devices. In some embodiments, the molding 922 encapsulating at least a portion of the first set 104(A) of semiconductor devices partially covers the first substrate side 918 of the interposer 904. In some embodiments, the multi-die package 902 is also molded or overmolded (not shown) at the second substrate side 920 encapsulating at least a portion of the second set 104(B) of semiconductor devices. In some embodiments, the molding encapsulating the second set 104(B) of semiconductor devices partially covers the second substrate side 920 of the interposer 904 such that the molding does not interfere with the electrical coupling between the interposer 904 and the circuit board 120.

In some embodiments, the system 900 includes a heat dissipator, such as a heat sink or heat spreader 202 located at the second circuit board side 124. The second set 104(B) of semiconductor devices is thermally coupled to the heat sink or heat spreader 202, typically through one or more thermal vias 130. In some embodiments, the second set 104(B) of semiconductor devices is thermally coupled to the thermal via(s) 130 through a layer 917 of TIM. In some embodiments, the heat sink or heat spreader 202 is thermally coupled to the thermal via(s) 130 through a layer 915 of TIM. In some embodiments, the heat sink or heat spreader 202 is coupled to a heat pipe and/or a fan in order to facilitate heat dissipation (in a similar manner to that shown in FIGS. 3A and 3B). In some embodiments, the heat sink or heat spreader 202 is made of aluminum or any other thermally conductive material (e.g., copper). In some embodiments, the system 900 also includes a heat sink or spreader 502. The heat sink or spreader 502 is thermally coupled to the first set 104(A) of semiconductor devices, typically through a layer 916 of TIM. In some embodiments, the heat sink or spreader 502 is coupled to a heat pipe and/or a fan. In some embodiments, the heat sink or spreader 502 is made of copper or any other thermally conductive material (e.g., aluminum).

As described above with reference to FIGS. 1A and 1B, heat generated by the first set 104(A) of semiconductor devices can be dissipated more effectively than heat generated by the second set 104(B) of semiconductor devices (due to the space constraints etc.). Therefore, in some embodiments, semiconductor devices (or a set of semiconductor devices) that generate more heat are positioned at the first side 918 of the interposer 904, while semiconductor devices (or a set of semiconductor devices) that generate less heat are positioned at the second side 920 of the interposer 904. Stated differently, the first set 104(A) of semiconductor devices generates more heat in use than the second set 104(B) of semiconductor devices. In some embodiments, at least one semiconductor device of the first set 104(A) of semiconductor devices generates more heat in use than respective semiconductor devices of the second set 104(B) of semiconductor devices.

However, in other embodiments, semiconductor devices that generate more heat are positioned at the second side 920 of the interposer 904, while semiconductor devices that generate less heat are positioned at the first side 918 of the interposer 904. Stated differently, the second set 104(B) of semiconductor devices generates more heat in use than the first set 104(A) of semiconductor devices, because although the heat generated by the second set 104(B) of semiconductor devices may not be dissipated as effectively, there can be other advantages to place a set of semiconductors that generates more heat on the second substrate side 920 (e.g., a short electrical connection to the circuit board, protection of the semiconductor devices from external interference (e.g., electrical, magnetic, and/or mechanical), etc.). In some embodiments, at least one semiconductor device of the second set 104(B) of semiconductor devices generates more heat in use than respective semiconductor devices of the first set 104(A) of semiconductor devices.

The system 900 allows heat generated at least by the second set 104(B) of semiconductor devices to be conducted from the first circuit board side 122 to the second circuit board side 124 at least partially through one or more removed portions of the circuit board 120. In some embodiments, the removed portion(s) of the circuit board 120 are filled or plated with a thermally conductive material. As mentioned above, in some embodiments, one or more thermal via(s) 130 are located in the removed portion(s) of the circuit board 120. In some embodiments, at least a portion of a heat dissipator or a heat conductor (e.g., 906 shown in FIG. 10) is located in the removed portion(s) of the circuit board 120. In some embodiments, the removed portion(s) are shaped and/or sized to match the multi-die package 902. In some embodiments, the removed portion is patterned to the semiconductor devices in the multi-die package 902 (in particular, the second set 104(B) of semiconductor devices).

In some embodiments, the system 900 allows heat generated by at least the second set 104(B) of semiconductor devices to be conducted from the first circuit board side 122 to the second circuit board side 124 substantially through the removed portion(s) of the circuit board 120. For example, in some embodiments, more than 50%, 60%, 70%, or 80% of the heat generated by the second set 104(B) of semiconductor devices is dissipated by the heat sink or heat spreader 202.

FIG. 10 is a partial cross-sectional view of yet another system 1000 for dissipating heat from a multi-die package. The system 1000 is similar to the system 900 shown in FIG. 9. In this embodiment, the heat sink or heat spreader 202 extends from the second circuit board side 124 to the first circuit board side 122. In the embodiment shown, the heat conductor 906 is a single solid thermal via, similar to the thermal via 402 shown in FIG. 4. In some embodiments, the heat conductor 906 is made of the same material as the heat sink or heat spreader 202. In some embodiments, the heat conductor 906 is integrated as part of the circuit board 120. In some embodiments, the heat conductor 906 and the heat sink or heat spreader 202 are integrally or unitarily formed. In some embodiments, the heat sink or heat spreader 202 is mechanically coupled to the second circuit board side 124 (e.g., using one or more screws, latches, mechanical pins, compliant elements, or any other couplers).

Figure 11:
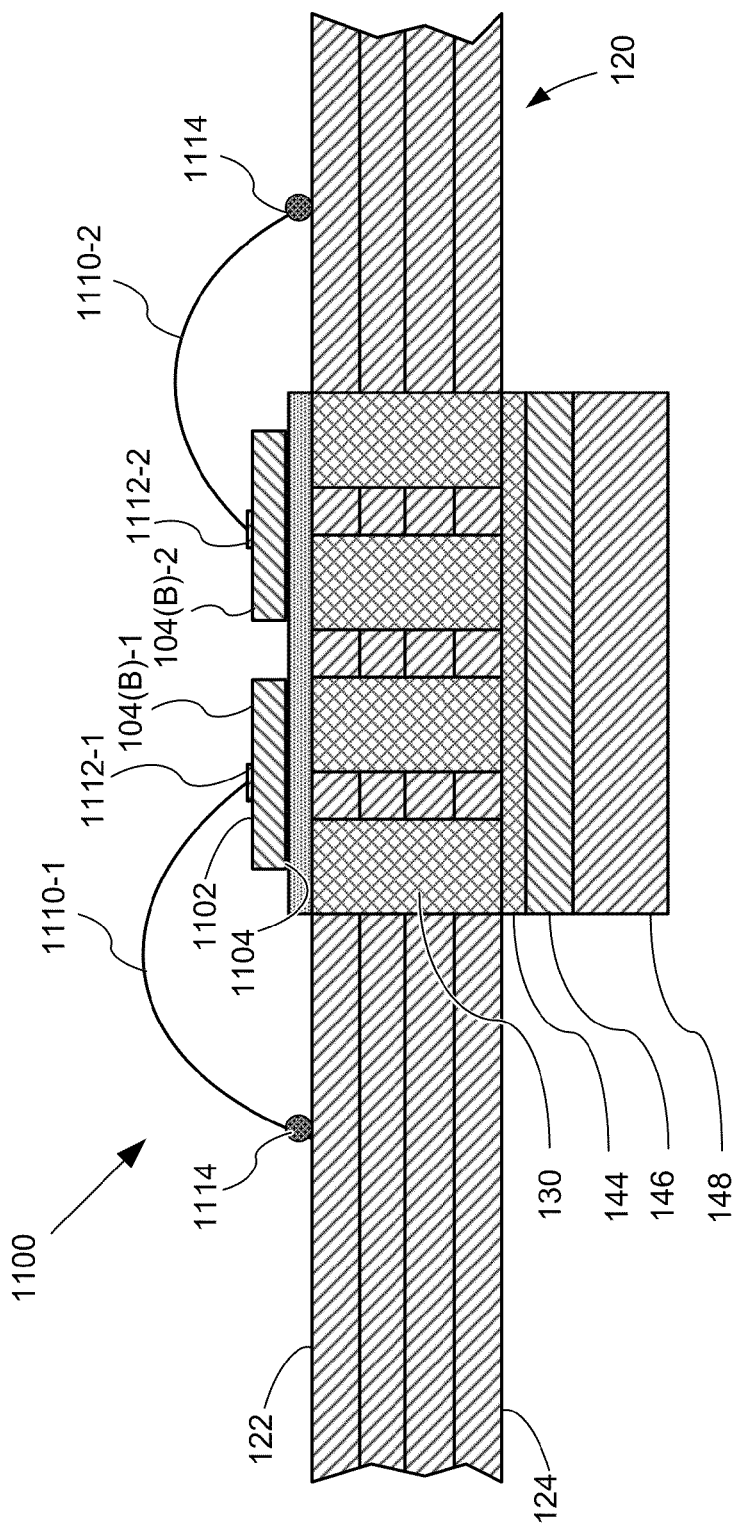
FIGS. 11 and 12 are partial cross sectional views of different systems for dissipating heat from stacks of semiconductor devices.

FIG. 11 is a partial cross-sectional view of yet another system 1100 for dissipating heat from a plurality of semiconductor devices. The system 1100 is similar to the system 100 shown in FIGS. 1A and 1B. In this embodiment, a set 104(B) of semiconductor devices (in particular, memory devices) are located at the first circuit board side 122. The set 104(B) of semiconductor devices has a first side 1102 and an opposing second side 1104. The first side 1102 of the semiconductor devices has electrical connectors 1112 (e.g., metalized pads, ball grids, pins, etc.), which may be directly connected to the circuit board 120 by, for example, wires 1110 and electrical connectors 1114. Alternatively, a substrate (e.g., the substrate 106 shown in FIG. 1) can be electrically coupled to the set 104(B) of semiconductor devices, as shown in FIGS. 1A and 1B. The second side 1104 of the semiconductor devices is thermally coupled to the heat dissipator 148.

Figure 12:
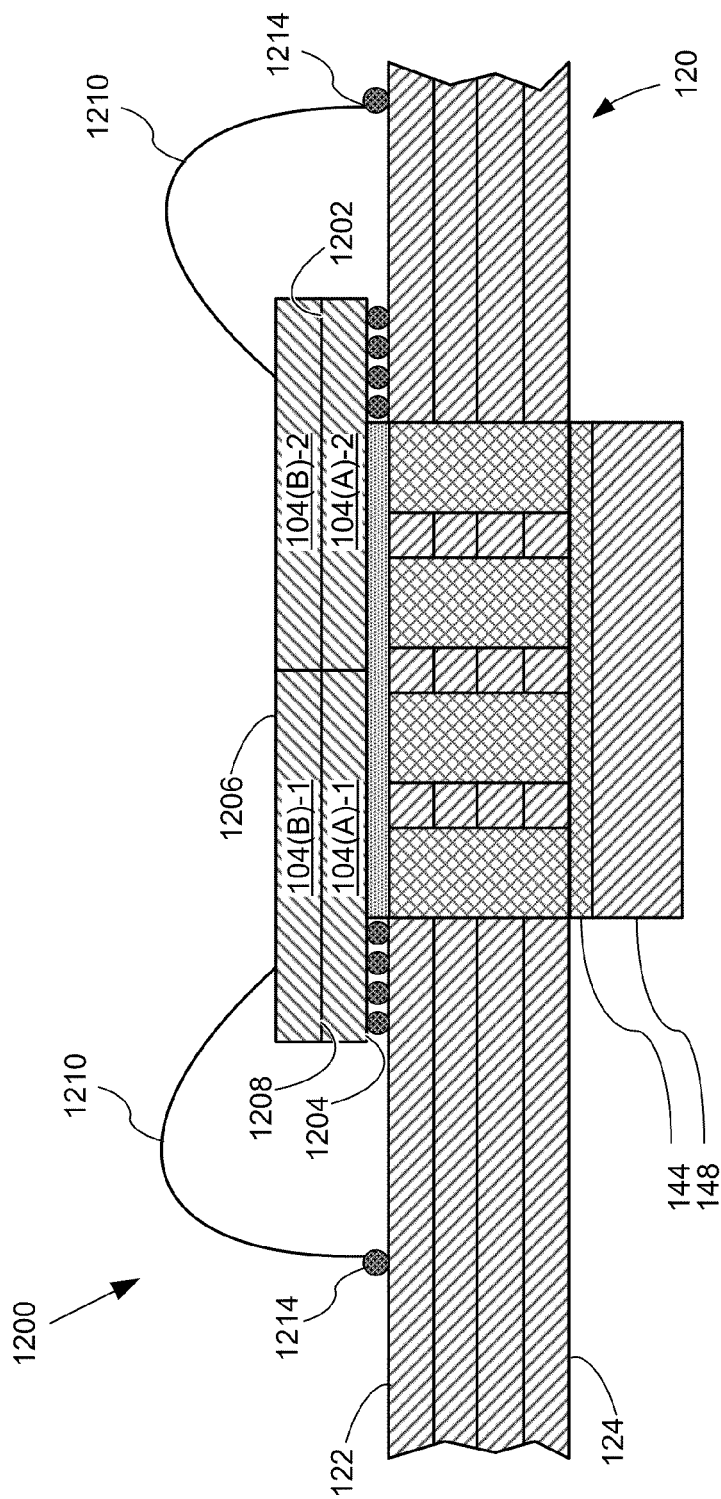

FIG. 12 is a partial cross-sectional view of yet another system 1200 for dissipating heat from a plurality of semiconductor devices. In this embodiment, a first set 104(A) of semiconductor devices has a first side 1202 and an opposing second side 1204. The second side 1204 of the first set 104(A) of semiconductor devices is thermally coupled to the heat dissipator 148. The second set 104(B) of semiconductor devices has a first side 1206 and an opposing second side 1208. The second side 1204 of the first set 104(A) of semiconductor devices is electrically connected to the first circuit board side 122 (e.g., using solder balls). The second side 1208 of the second set 104(B) of semiconductor devices is mechanically coupled to the first side 1202 of the first set 104(A) of semiconductor devices (e.g., by adhesives, common packaging, etc.). In some embodiments, the second set 104(B) of semiconductor devices are electrically coupled to the first circuit board side 122 (e.g., by one or more wires 1210 and electrical connectors 1214; by vias; or by any other suitable electrical coupling between the first set 104(A) of semiconductor devices and the second set 104(B) of semiconductor devices).

Figure 13:
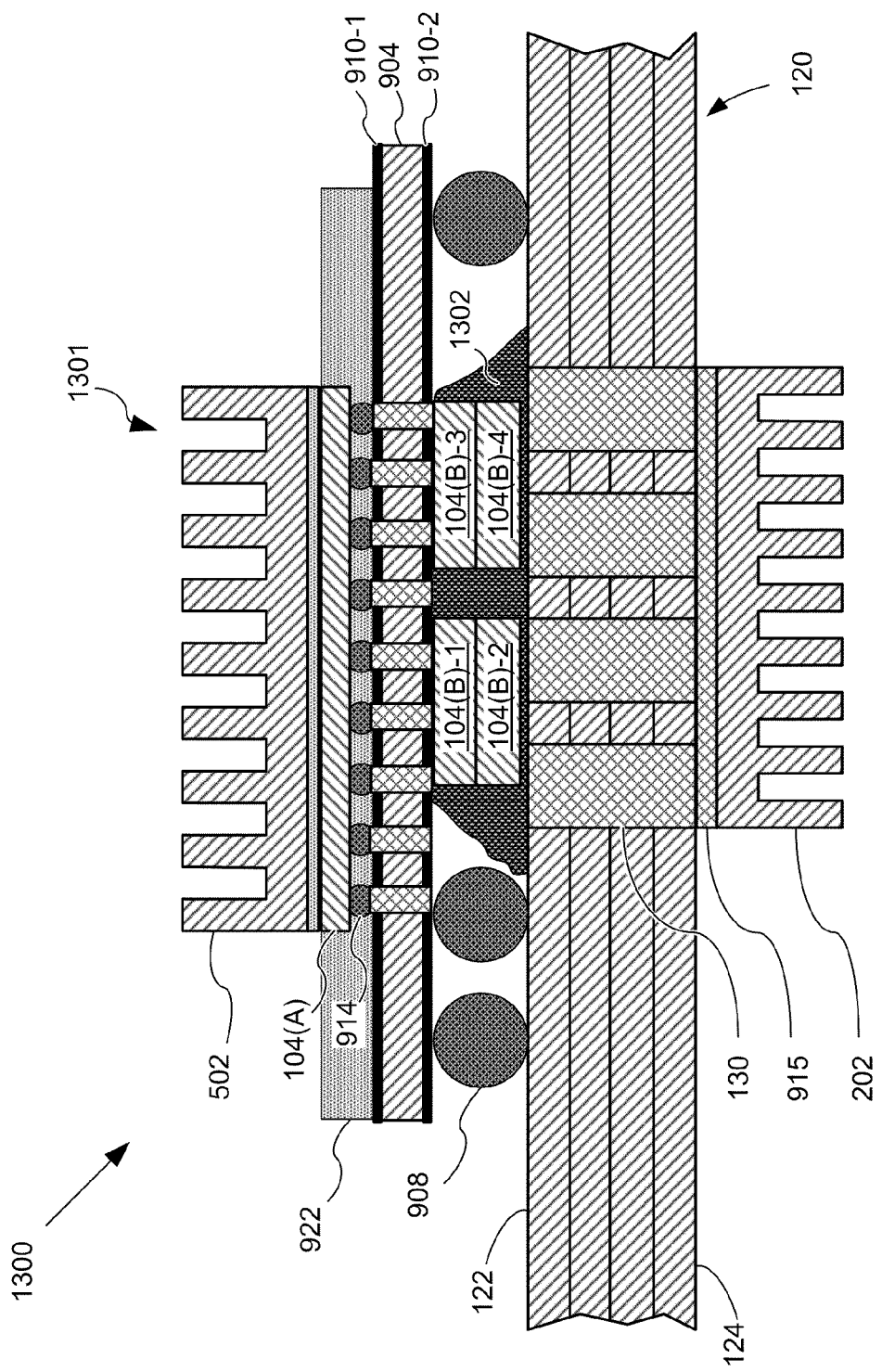

FIG. 13 is a partial cross-sectional view of yet another system 1300 for dissipating heat from a multi-die package 1301. The system 1300 is similar to the system 900 shown in FIG. 9. In this embodiment, a second set 104(B) of semiconductor devices includes one or more stacks of semiconductor devices (e.g., a stack of semiconductor devices 104(B)-1 and 104(B)-2 and a stack of semiconductor devices 104(B)-3 and 104(B)-4). In some embodiments, each stack of semiconductor devices in the second set 104(B) of semiconductor devices includes a stack of two or more semiconductor devices. In some embodiments, a first set 104(A) of semiconductor devices also includes one or more stacks of semiconductor devices (not shown). In some embodiments, each stack of semiconductor devices in the first set 104(A) of semiconductor devices includes a stack of two or more semiconductor devices.

The second set 104(B) of semiconductor devices is thermally coupled to the heat sink or heat spreader 202 (e.g., through TIM 915). In some embodiments, the second set 104(B) of semiconductor devices is thermally coupled to the thermal vias 130 through the TIM 1302 (e.g., thermal paste). As shown in FIG. 13, the TIM 1302 can contact sides of the semiconductor devices 104 in the second set 104(B) to improve the heat transfer from the second set 104(B) of semiconductor devices to the heat sink or heat spreader 202. Alternatively, the TIM 1302 (e.g., thermal pads) can be positioned only between the respective bottom semiconductor devices (e.g., 104(B)-2 and 104(B)-4) and the thermal vias 130.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. The presently disclosed embodiments are therefore to be considered in all respects as illustrative and not restrictive, the scope of the invention being indicated by the appended claims, and not limited to the foregoing description.

What is claimed is:

1. A semiconductor system, comprising:
   a circuit board having a substantially planar first circuit board side and an opposing substantially planar second circuit board side;
   a multi-die package located at the first circuit board side, the multi-die package comprising:
      a substrate having a substantially planar first substrate side and an opposing substantially planar second substrate side;
      a first set of one or more semiconductor devices coupled to the first substrate side; and
      a second set of one or more semiconductor devices coupled to the second substrate side; and
   a heat dissipator located at the second circuit board side and thermally coupled to the second set of semiconductor devices, wherein one or more portions of the circuit board are removed between the first circuit board side and the second circuit board side so as to define one or more holes through the circuit board and to facilitate thermal coupling between the second set of semiconductor devices and the heat dissipator through the one or more holes.

2. The system of claim 1, wherein the multi-die package is electrically coupled to the circuit board.

3. The system of claim 1, wherein the circuit board and the substrate are electrically coupled to each other by one or more solder connections.

4. The system of claim 1, wherein the first and second sets of semiconductor devices are soldered to the substrate.

5. The system of claim 1, further comprising solder balls at the first circuit board side, wherein the solder balls electrically connect the first circuit board side and the second substrate side.

6. The system of claim 1, wherein the first set of semiconductor devices is configured to generate more heat in use than the second set of semiconductor devices.

7. The system of claim 1, wherein at least one semiconductor device of the first set of semiconductor devices is configured to generate more heat in use than respective semiconductor devices of the second set of semiconductor devices.

8. The system of claim 1, wherein the second set of semiconductor devices includes one or more memory devices.

9. The system of claim 1, wherein the first or second set of semiconductor devices includes at least one processor device.

10. The system of claim 1, wherein the first or second set of semiconductor devices includes a stack of semiconductor devices.

11. The system of claim 1, wherein the heat dissipator extends from the second circuit board side to the first circuit board side through the one or more removed portions of the circuit board.

12. The system of claim 1, wherein the heat dissipator comprises multiple thermal vias.

13. The system of claim 1, wherein at least one via is formed at least in the one or more removed portions of the circuit board, each via being filled or plated with a thermally conductive material.

14. The system of claim 1, wherein the heat dissipator is a heat spreader thermally coupled to a cooling fan.

15. The system of claim 1, wherein the heat dissipator is a heat pipe coupled to a heat spreader.

16. The system of claim 1, wherein the heat dissipator is a heat conductor coupled to a heat spreader.

17. The system of claim 1, wherein the multi-die package is mechanically coupled to the circuit board.

18. A semiconductor system, comprising:
a first set of one or more semiconductor devices, the first set having a first side and an opposing second side;
a substrate having a substantially planar first substrate side and an opposing substantially planar second substrate side, the first substrate side being coupled to the second side of the first set of semiconductor devices;
a second set of one or more semiconductor devices, the second set having a first device side and an opposing second device side, the first side of the second set of semiconductor devices being coupled to the second substrate side;
a circuit board having a substantially planar first circuit board side and an opposing substantially planar second circuit board side, wherein the first circuit board side being coupled to the second substrate side; and
a heat dissipator located at the second circuit board side and thermally coupled to the second side of the second set of semiconductor devices, wherein one or more portions of the circuit board are removed between the first circuit board side and the second circuit board side so as to define one or more holes through the circuit board and to facilitate thermal coupling between the second set of semiconductor devices and the heat dissipator through the one or more holes.

19. A semiconductor system, comprising:
a circuit board having a substantially planar first circuit board side and an opposing substantially planar second circuit board side, wherein at least one hole is defined through the circuit board from the first circuit board side to the second circuit board side;
a set of one or more semiconductor devices located at the first circuit board side, the set having a first side and an opposing second side, wherein the first side includes one or more electrical connectors; and
a heat dissipator located at the second side of the circuit board and thermally coupled to the second side of the set of one or more semiconductor devices through the at least one hole defined through the circuit board so as to allow heat generated by the set of one or more memory devices during use to be dissipated by the heat dissipator.

20. The system of claim 19, wherein the one or more electrical connectors include one or more metal pads.

* * * * *